(12) United States Patent
Mizukoshi

(10) Patent No.: US 9,656,454 B2
(45) Date of Patent: May 23, 2017

(54) SCREEN PRINTING METHOD AND SCREEN PRINTING DEVICE

(71) Applicant: FUJI MACHINE MFG. CO., LTD., Chiryu (JP)

(72) Inventor: Tsuyoshi Mizukoshi, Chiryu (JP)

(73) Assignee: FUJI MACHINE MFG. CO., LTD., Chiryu (JP)

( * ) Notice: Subject to any disclaimer, the term of this patent is extended or adjusted under 35 U.S.C. 154(b) by 0 days.

(21) Appl. No.: 14/903,339

(22) PCT Filed: Jul. 11, 2013

(86) PCT No.: PCT/JP2013/068962
§ 371 (c)(1),
(2) Date: Jan. 7, 2016

(87) PCT Pub. No.: WO2015/004768
PCT Pub. Date: Jan. 15, 2015

(65) Prior Publication Data
US 2016/0200091 A1    Jul. 14, 2016

(51) Int. Cl.
*B41F 15/44* (2006.01)
*B41F 15/08* (2006.01)
(Continued)

(52) U.S. Cl.
CPC .............. *B41F 15/44* (2013.01); *B41F 15/08* (2013.01); *B41F 15/12* (2013.01); *B41F 15/36* (2013.01);
(Continued)

(58) Field of Classification Search
CPC ...... B41F 15/08; B41F 15/0881; B41F 15/12; B41F 15/16; B41F 15/18; B41F 15/20;
(Continued)

(56) References Cited

U.S. PATENT DOCUMENTS 5,887,520 A   3/1999  Kinoshita
6,170,394 B1  1/2001  Kinoshita
(Continued)

FOREIGN PATENT DOCUMENTS

JP    8-252988 A    10/1996
JP    2004-17512 A  1/2004
(Continued)

OTHER PUBLICATIONS

Extended European Search Report issued Jun. 2, 2016 in Patent Application No. 13889212.0.
(Continued)

*Primary Examiner* — Blake A Tankersley
*Assistant Examiner* — Marissa Ferguson Samreth
(74) *Attorney, Agent, or Firm* — Oblon, McClelland, Maier & Neustadt, L.L.P.

(57) ABSTRACT

A screen printing method includes performing a destaticizing action that removes static electricity with which a screen mask is charged, through a mask support member, which is positioned on a lateral side of a circuit board, before bringing the circuit board into contact with a lower surface of the screen mask, by bringing the conductive mask support member into contact with a lower surface of the screen mask as a result of raising the mask support member. The method includes subsequently performing screen printing by bringing the circuit board into contact with the lower surface of the screen mask as a result of raising the circuit board.

8 Claims, 7 Drawing Sheets

(51) Int. Cl.
  *B41F 15/12* (2006.01)
  *B41F 15/36* (2006.01)
  *H05K 3/12* (2006.01)

(52) U.S. Cl.
  CPC .......... *H05K 3/1225* (2013.01); *H05K 3/1233* (2013.01); *H05K 2203/0139* (2013.01)

(58) Field of Classification Search
  CPC .......... B41F 15/26; B41F 15/36; B41F 15/44; H05K 3/1225; H05K 3/1233; H05K 2203/0139
  See application file for complete search history.

(56) References Cited

U.S. PATENT DOCUMENTS

| | | | | |
|---|---|---|---|---|
| 6,659,005 | B2* | 12/2003 | Takahashi | B41F 15/0818 |
| | | | | 101/123 |
| 9,315,013 | B2* | 4/2016 | Horie | B41F 15/20 |
| 2009/0193986 | A1* | 8/2009 | Kusunoki | B41F 15/36 |
| | | | | 101/114 |
| 2012/0000381 | A1* | 1/2012 | Abe | B41F 15/0818 |
| | | | | 101/123 |
| 2015/0144683 | A1* | 5/2015 | Ootake | B23K 3/0638 |
| | | | | 228/248.1 |
| 2015/0216058 | A1* | 7/2015 | Mantani | B41F 15/12 |
| | | | | 427/282 |

FOREIGN PATENT DOCUMENTS

| | | | |
|---|---|---|---|
| JP | 2005-88343 A | 4/2005 | |
| JP | 2008-6719 | * 1/2008 | .............. B41F 15/36 |

OTHER PUBLICATIONS

International Search Report issued Aug. 13, 2013 in PCT/JP2013/068962 filed Jul. 11, 2013.

* cited by examiner

SCREEN PRINTING METHOD AND SCREEN PRINTING DEVICE

TECHNICAL FIELD

The present disclosure relates to a screen printing method and a screen printing device that perform screen printing of a predetermined pattern on a circuit board after removing static electricity with which a screen mask is charged.

BACKGROUND ART

In a screen printing device, since an upper surface of a screen mask is frictioned by a squeegee as a result of a squeegeeing action when screen printing is performed on an upper surface of a circuit board by placing a screen mask thereon, it is likely that the screen mask will become charged with static electricity. If the screen mask becomes charged with static electricity, in a case of performing screen printing on an upper surface of a circuit board on which an electronic component is mounted on a lower surface thereof, there is a possibility that the delicate circuits inside the electronic component, which are on a lower surface side of the circuit board, will break as a result of the discharge of the static electricity from the screen mask. In addition, even in a case of performing screen printing on an upper surface of a circuit board on which an electronic component is not mounted on a lower surface thereof, there is a possibility that the circuit board will become charged with static electricity as a result of the static electricity on a screen mask side transferring to the circuit board, which is contact with a lower surface of the screen mask, and that the delicate circuits inside an electronic component, which is subsequently mounted, will break.

In order to prevent such damage to an electronic component as a result of the discharge of static electricity from a screen mask, as disclosed in PTL 1 (JP-A-2004-17512), there are screen printing methods that are configured so that an earth line is connected between a mask holder that holds a screen mask, and an upper surface of the screen mask, and static electricity with which the screen mask is charged, is released to an earth side through the earth line and the mask holder, or static electricity is released from the screen mask as a result of bringing a destaticizing brush, which is connected to the earth side, into contact with the upper surface of the screen mask.

In addition, in a case in which a screen mask is formed of plastic, as disclosed in PTL 2 (JP-A-8-252988), there are screen printing methods that are configured so that a conductive layer is formed on both upper and lower surfaces of a screen mask, and static electricity is removed from the screen mask through the conductive layer and a clamp member that clamps a circuit board.

CITATION LIST

Patent Literature

PTL 1: JP-A-2004-17512
PTL 2: JP-A-8-252988

SUMMARY

Technical Problem

However, in a destaticizing method in which an earth line is connected to an upper surface side of a screen mask in the manner of PTL 1, it is necessary to reattach the earth line to the screen mask each time the screen mask is exchanged, and the work of doing so is troublesome. In addition, in a destaticizing method in which a destaticizing brush is connected to an upper surface of a screen mask, it is necessary to change the position of the destaticizing brush depending on the size of the screen mask and movement range of a squeegee so that the destaticizing brush does not interfere with the squeegee each time the screen mask is exchanged, and the work of doing so is troublesome.

In addition, in a destaticizing method in which static electricity is removed from a screen mask through a conductive layer that is formed on both upper and lower surfaces of the screen mask, and a clamp member that clamps a circuit board in the manner of PTL 2, since a state in which, the circuit board is in contact with the clamp member in addition to the conductive layer on the lower surface of the screen mask, is attained during screen printing, there is a possibility that a portion of the static electricity that is released to the conductive layer and the clamp member from the screen mask will charge the circuit board, and therefore, the effect of preventing damage to an electronic component due to the discharge of static electricity from the screen mask is less than that of PTL 1.

Additionally, in the destaticizing methods of PTL 1 and PTL 2, it is necessary to provide an earth line, a destaticizing brush, or a conductive layer in both methods, and therefore, there is a drawback in that there is a resulting increase in cost.

Solution to Problem

In order to solve the abovementioned technical problem, the present disclosure provides a screen printing device and a screen printing method that performs screen printing of a predetermined pattern on an upper surface of a circuit board, which is carried into an area below a screen mask, by raising the circuit board, holding the circuit board in a state of coming into contact with a lower surface of the screen mask, and moving a squeegee while the squeegee is in contact with an upper surface of the screen mask, the method including performing a destaticizing action that removes static electricity with which a screen mask is charged, through a conductive mask support member, which is positioned on a lateral side of the circuit board, before bringing the circuit board into contact with the lower surface of the screen mask, by bringing the mask support member into contact with the lower surface of the screen mask as a result of raising the mask support member, and subsequently performing screen printing by bringing the circuit board into contact with the lower surface of the screen mask as a result of raising the circuit board.

Since the present disclosure can remove static electricity with which the screen mask is charged, through the conductive mask support member before bringing the circuit board into contact with the lower surface of the screen mask, by performing a raising action of the mask support member at a timing that is earlier than a raising action of the circuit board, it is possible to reliably prevent the discharge of static electricity from the screen mask to the circuit board, and therefore, it is possible to reliably prevent damage to an electronic component due to the discharge of static electricity from the screen mask. Additionally, an action that makes the raising timing of the mask support member earlier than the raising timing of the circuit board can be automatically controlled by a screen printing device, and it is not necessary for an operator to perform the reattachment of an earth line or the change of a position of a destaticizing brush each time the screen mask is exchanged, and therefore, it is possible to simplify the exchange work of the screen mask by that extent. In addition, since the destaticizing action of the present disclosure can be operated by merely changing a control program of a screen printing device, it is possible to realize a destaticizing function of static electricity at low cost.

The present disclosure may be configured so as to perform screen printing after performing the destaticizing action in only a case of performing screen printing on an upper surface of a circuit board on which an electronic component is mounted on a lower surface thereof, and to perform screen printing by bringing the mask support member and the circuit board into contact with the lower surface of the screen mask as a result of simultaneously raising the mask support member and the circuit board in a state in which the heights of the respective upper surfaces of the mask support member and the circuit board are aligned without performing the destaticizing action in a case of performing screen printing on an upper surface of a circuit board on which an electronic component is not mounted on a lower surface thereof. The reason for this is that it is likely that damage to an electronic component due to the discharge of static electricity from the screen mask will occur in a case of performing screen printing on an upper surface of a circuit board on which an electronic component is mounted on a lower surface thereof. Since, in comparison with a case in which an electronic component is mounted on a lower surface of a circuit board, adverse effects due to the discharge of static electricity from the screen mask are scarce in a case of performing screen printing on an upper surface of a circuit board on which an electronic component is not mounted on a lower surface thereof, if screen printing is performed by bringing the mask support member and the circuit board into contact with the lower surface of the screen mask as a result of simultaneously raising the mask support member and the circuit board without performing the destaticizing action, it is possible to reduce the time required to perform screen printing once by the amount of time taken to perform the destaticizing action, and therefore, it is possible to improve the productivity.

The present disclosure may be configured so as to perform the destaticizing action each time before performing screen printing, but since it is thought that the charge amount of the static electricity with which the screen mask is charged by a single screen printing is comparatively small, the present disclosure may be configured so as to perform the destaticizing action each time that screen printing, which does not perform the destaticizing action, is performed a predetermined number of times (or in other words, each time the screen mask is charged with a charge amount for which discharge is possible). According to this configuration, it is possible to greatly reduce the number of times that the destaticizing action is performed with respect to the number of times of screen printing.

The present disclosure may be configured so that a vacuum hole, which vacuums the screen mask at a negative pressure during screen printing, is formed on an upper surface of the mask support member, and when the destaticizing action is performed, the upper surface of the mask support member is brought into close contact with the lower surface of the screen mask using a negative pressure vacuuming force as a result of a negative pressure acting on the vacuum hole. According to this configuration, it is possible to decrease conductive resistance between the screen mask and the mask support member, and therefore, it is possible to facilitate the release of static electricity to the mask support member from the screen mask.

DESCRIPTION OF EMBODIMENTS

Figure 1:
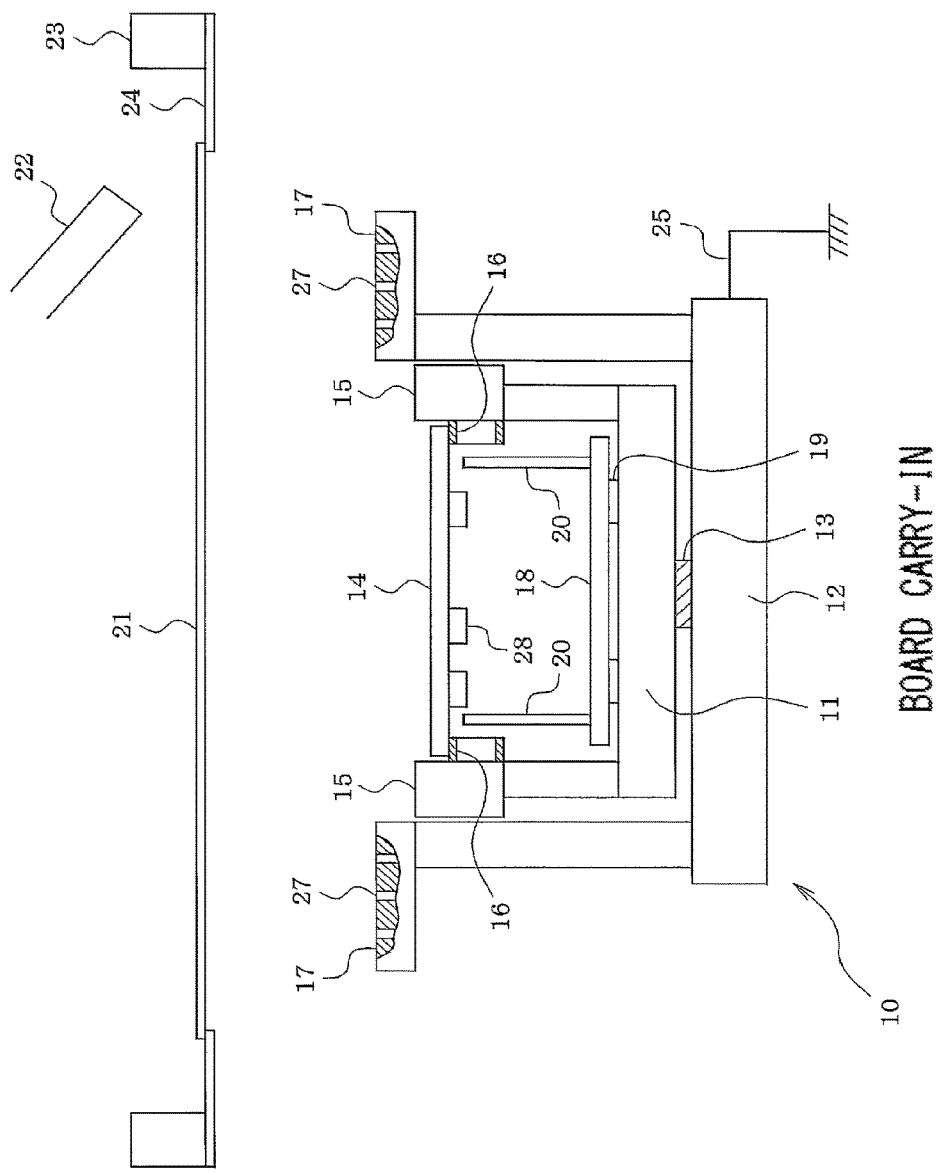
FIG. 1 is a view that describes an action that carries a circuit board into an area below a screen mask of a screen printing device of an embodiment of the present disclosure.

Hereinafter, an embodiment which embodies forms for implementing the present disclosure will be described. Firstly, a configuration of a screen printing device 10 will be described using FIGS. 1 to 6.

Two-stage upper and lower ascending and descending tables 11 and 12 are provided in the screen printing device 10 so as to be capable of ascending and descending, and the upper stage ascending and descending table 11 is supported on the lower stage ascending and descending table 12 so as to be capable of ascending and descending by an ascending and descending mechanism 13. The lower stage ascending and descending table 12 is supported so as to be capable of ascending and descending by an ascending and descending mechanism 26 (refer to FIG. 7).

Side clampers 15 that clamp the edges of both sides of a circuit board 14 in a manner that nips the edges of both sides of the circuit board 14 are provided on both sides of the upper stage ascending and descending table 11. An interval between side clampers 15 of both sides is matched to the width of the circuit board 14 that is clamped, and is adjusted by a feed screw mechanism 37 (refer to FIG. 7). A conveyor 16 for carrying the circuit board 14 in and out is provided on an inner side of the side clamper 15, and the edges of both sides of the circuit board 14 are clamped on the conveyor 16 by the side clamper 15.

Figure 7:
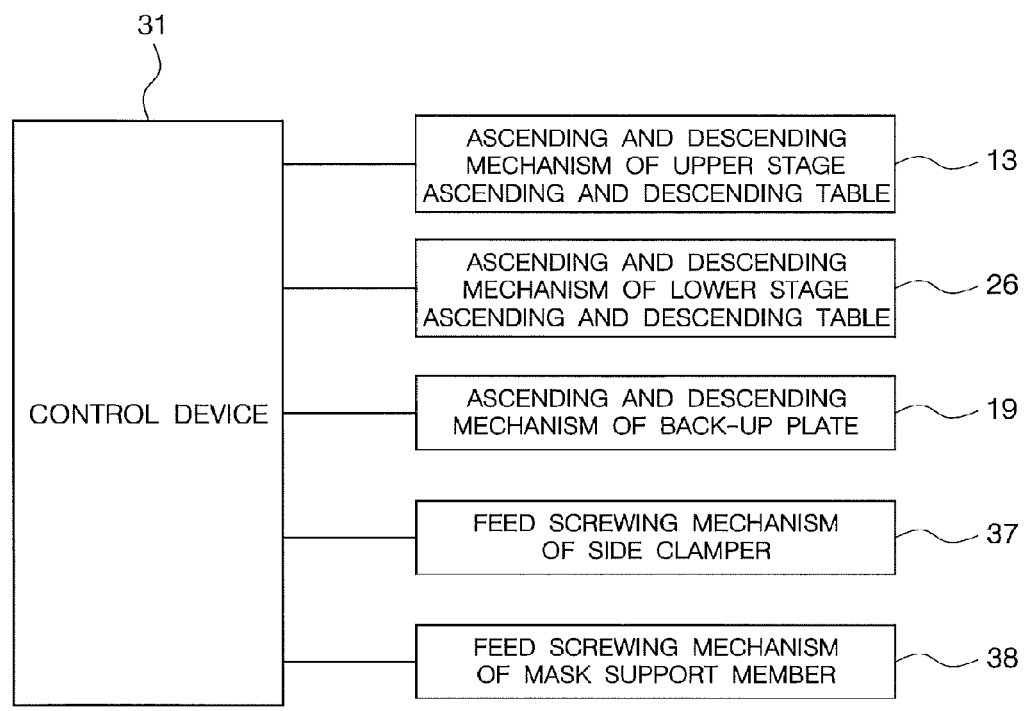
FIG. 7 is a block diagram that shows a configuration of a control system of the screen printing device.

Conductive mask support members 17 are provided on the lower stage ascending and descending table 12 adjacent to each side clamper 15, and an interval between the mask support members 17 of both sides is matched to the width of the conveyor 16 (the interval of the side clampers 15), and is adjusted by a feed screw mechanism 38 (refer to FIG. 7).

A back-up plate 18 is provided on the upper stage ascending and descending table 11 so as to be capable of ascending and descending due to an ascending and descending mechanism 19, and a plurality of back-up pins 20 for supporting and holding up the circuit board 14 from below are provided on the back-up plate 18.

A screen mask 21 is disposed horizontally above the mask support members 17 and the side clampers 15, and a squeegee 22 is disposed above the screen mask 21. The screen mask 21 is formed of a metal plate or the like, and is attached to a mask attachment frame 23 via a tension film 24 that is manufactured from an insulating elastic material.

The mask support members 17 are formed on horizontal flat surfaces so that static electricity moves from the screen mask 21 to the mask support members 17 as a result of upper surfaces thereof coming into close contact with a lower surface of the screen mask 21. The mask support members 17 and the lower stage ascending and descending table 12 are respectively formed of conductive materials such as metals, are electrically connected to one another, and a grounded earth line 25 is connected to the lower stage ascending and descending table 12. As a result of this, when the mask support members 17 are brought into contact with the lower surface of the screen mask 21, the screen mask 21 attains a state of being grounded through the mask support members 17, the lower stage ascending and descending table 12 and the earth line 25, and static electricity with which the screen mask 21 is charged is released to an earth side by a pathway of the mask support members 17→the lower stage ascending and descending table 12→the earth line 25.

Furthermore, vacuum holes 27, which vacuum the screen mask 21 at a negative pressure during screen printing, are formed on upper surfaces of the mask support members 17, and when a destaticizing action, which will be described later, is performed, the lower surface of the screen mask 21 is also brought into close contact with the upper surfaces of the mask support members 17 using a negative pressure vacuuming force as a result of a negative pressure acting on the vacuum holes 27.

The screen printing device 10 that is configured in the abovementioned manner is provided with a control device 31 (refer to FIG. 7) as control device. The control device 31 controls the actions of the screen printing device 10 including an ascending and descending action of the circuit board 14, an ascending and descending action of the mask support members 17, and a movement action of the squeegee 22.

When screen printing is performed using the screen printing device 10 by placing the circuit board 14 on the lower surface of the screen mask 21, since the upper surface of the screen mask 21 is frictioned by the squeegee 22 as a result of a squeegeeing action, it is likely that the screen mask 21 will become charged with static electricity. If the screen mask 21 becomes charged with static electricity, in a case of performing screen printing on an upper surface of the circuit board 14 on which an electronic component 28 is mounted on a lower surface thereof, there is a possibility that the delicate circuits inside the electronic component 28, which are on the lower surface side of the circuit board 14, will break as a result of the discharge of the static electricity from the screen mask 21.

In such an instance, in the present embodiment, the control device 31 performs a destaticizing action that removes static electricity with which the screen mask 21 is charged, through the conductive mask support members 17, which is positioned on a lateral side of the circuit board 14, before bringing the circuit board 14 into contact with the lower surface of the screen mask 21, by bringing the mask support members 17 into contact with the lower surface of the screen mask 21 as a result of raising the mask support members 17 in a case of performing screen printing on an upper surface of the circuit board 14 on which the electronic component 28 is mounted on a lower surface thereof. And then by bringing the circuit board 14 into contact with the lower surface of the screen mask 21 as a result of raising the circuit board 14, screen printing is performed.

Hereinafter, a screen printing method including a destaticizing action of a case of performing screen printing on an upper surface of the circuit board 14 on which the electronic component 28 is mounted on a lower surface thereof, will be described with reference to FIGS. 1 to 6.

Firstly, as shown in FIG. 1, the control device 31 carries the circuit board 14 on which the electronic component 28 is mounted on the lower surface thereof, into a predetermined printing position below the screen mask 21 by placing the circuit board 14 on the conveyor 16 in a state in which the heights of the upper surfaces of the mask support members 17 are set to be higher than the heights of the upper surfaces of the side clampers 15.

Figure 2:
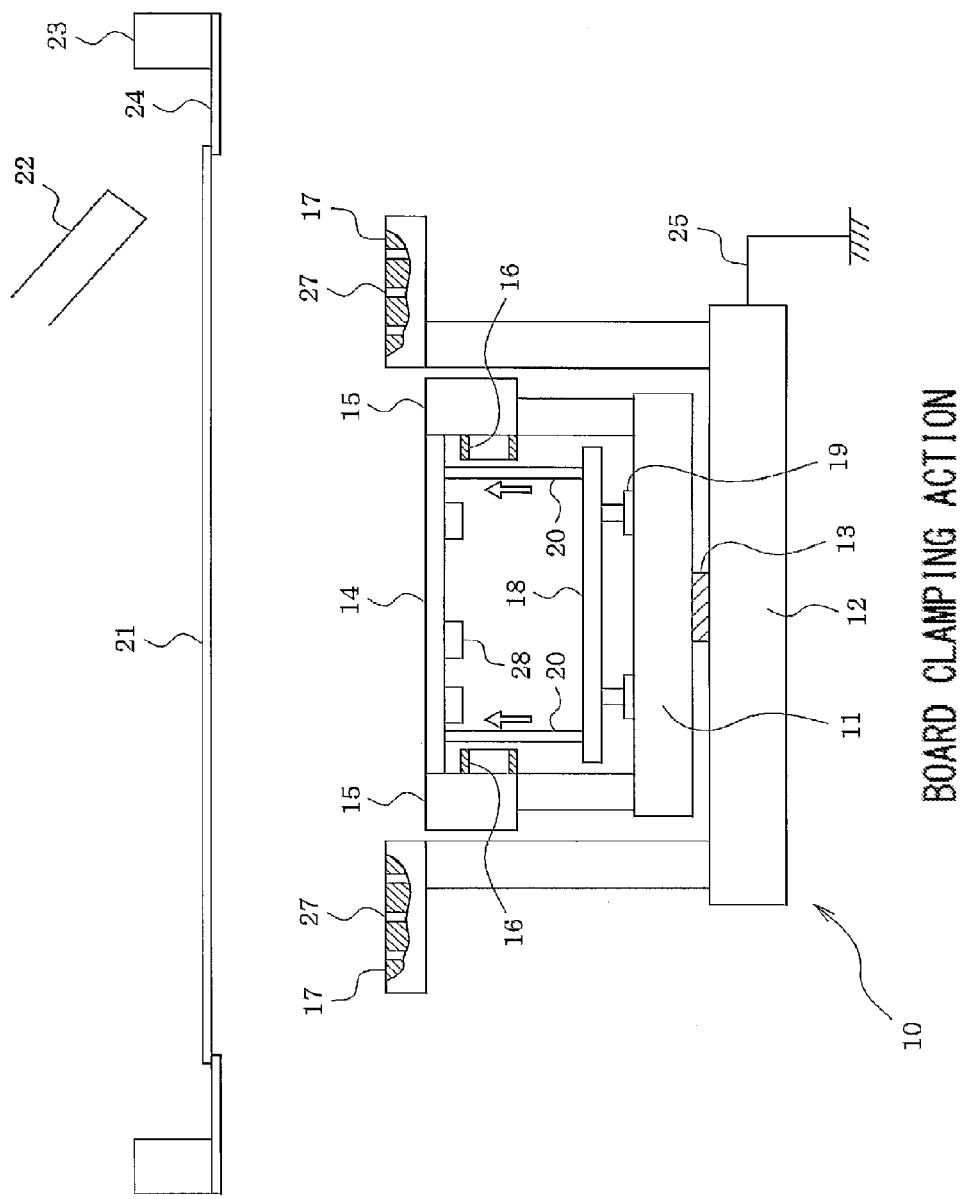
FIG. 2 is a view that describes an action that clamps the circuit board that is carried into an area below the screen mask using a clamp member.

As shown in FIG. 2, the control device 31 subsequently pushes the circuit board 14 up at the upper ends of the back-up pins 20 on the back-up plate 18 by raising the back-up plate 18 using the ascending and descending mechanism 19, and stops the raising action of the circuit board 14 in a state in which the height of the upper surface of the circuit board 14 is aligned with the heights of the upper surfaces of the side clampers 15. Thereafter, the control device 31 clamps the edges of both sides of the circuit board 14 by narrowing an interval between the side clampers 15.

Figure 3:
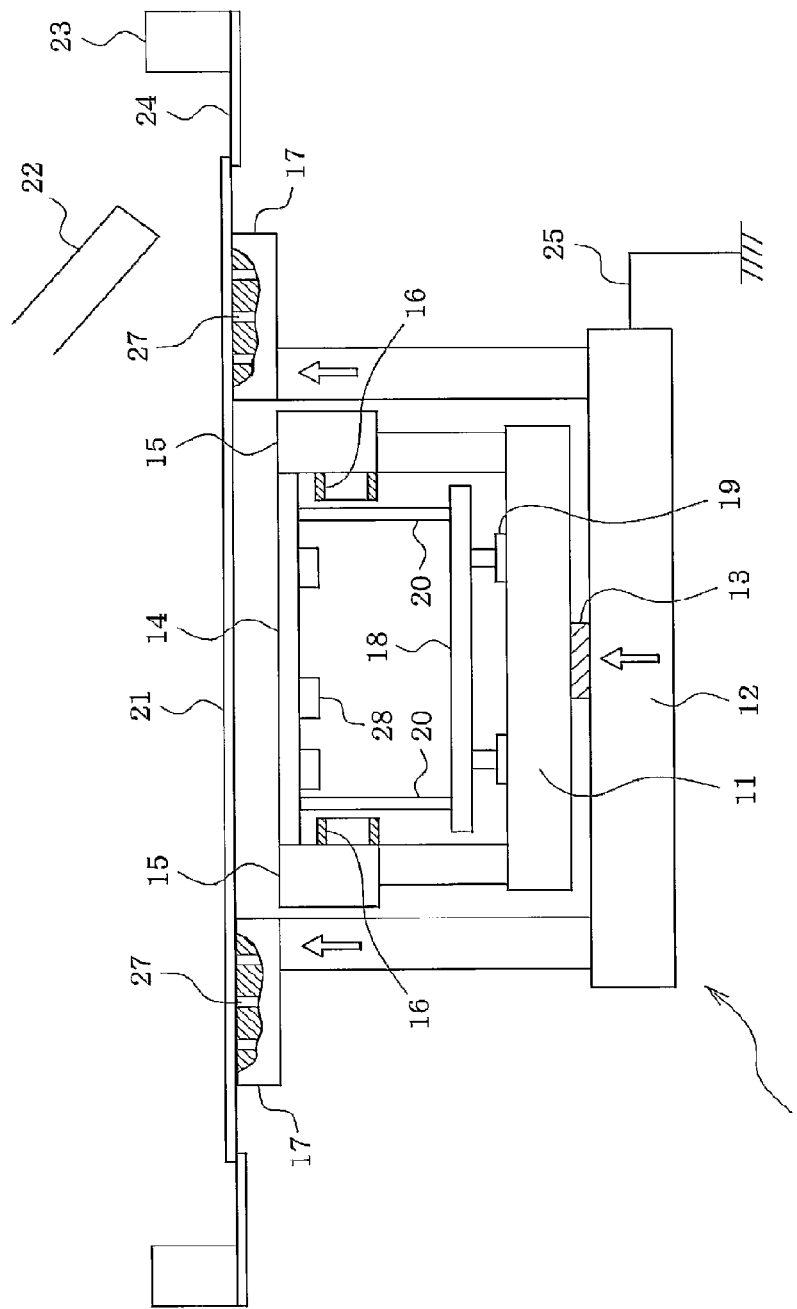
FIG. 3 is a view that describes an action that performs destaticization by bringing a mask support member into contact with a lower surface of the screen mask as a result of raising the mask support member.

As shown in FIG. 3, the process subsequently proceeds to the destaticizing action, and the control device 31 raises the lower stage ascending and descending table 12, and stops the raising action of the ascending and descending table 12 in a state in which the mask support members 17 are in contact with the lower surface of the screen mask 21. At this time, the control device 31 brings the lower surface of the screen mask 21 into close contact with the upper surfaces of the mask support members 17 using a negative pressure vacuuming force as a result of a negative pressure acting on the vacuum holes 27 on the upper surfaces of the mask support members 17. As a result of this, the screen mask 21 is grounded through the mask support members 17, the lower stage ascending and descending table 12 and the earth line 25, and static electricity with which the screen mask 21 is charged is released to an earth side by a pathway of the mask support members 17→the lower stage ascending and descending table 12→the earth line 25. In this case, since it is possible to bring the lower surface of the screen mask 21 into close contact with the upper surfaces of the mask support members 17 using the negative pressure vacuuming force, it is possible to decrease conductive resistance between the screen mask 21 and the mask support members 17, and therefore, it is possible to facilitate the release of static electricity to the mask support members 17 from the screen mask 21.

Figure 4:
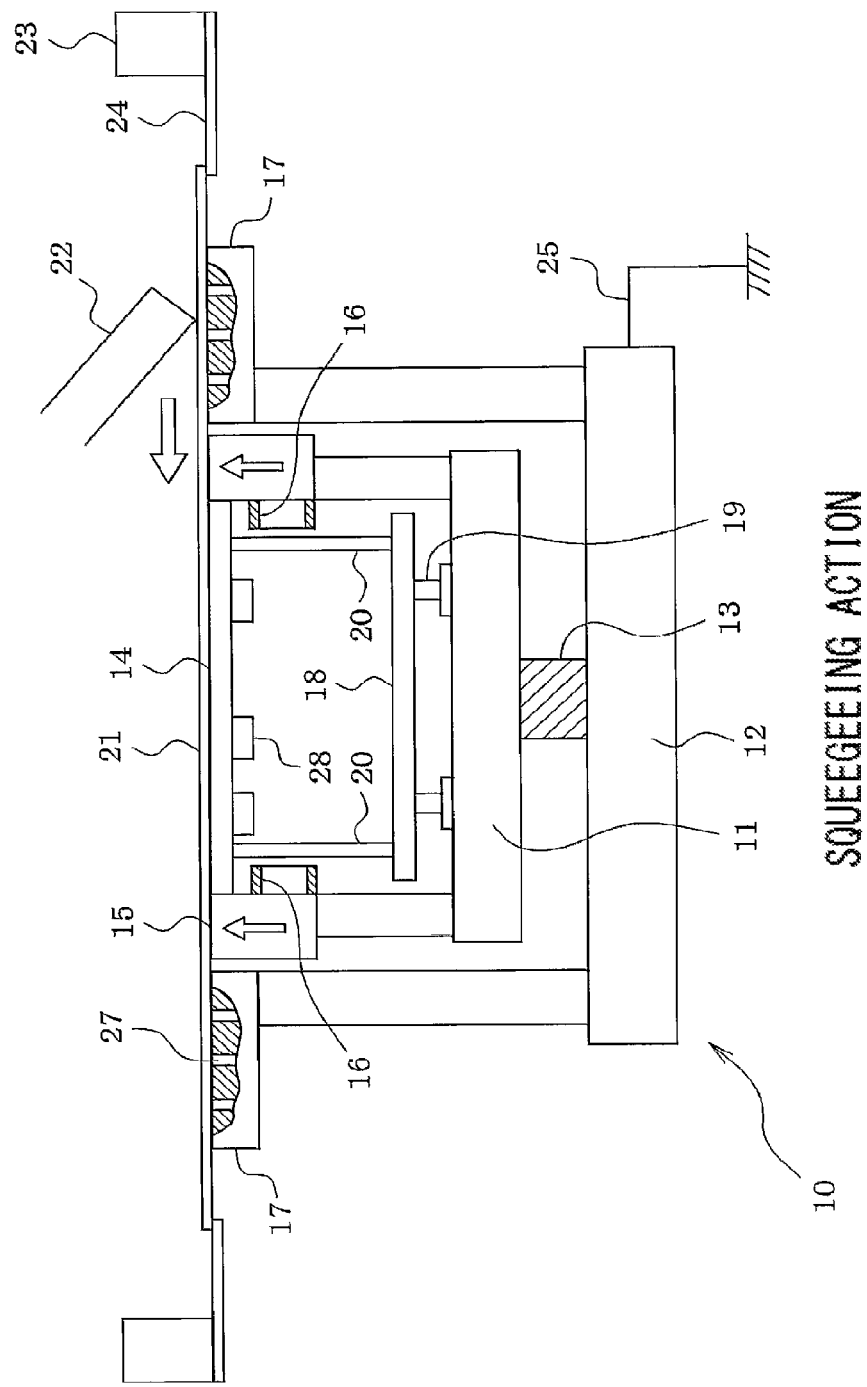
FIG. 4 is a view that describes an action that performs screen printing by bringing the circuit board into contact with the lower surface of the screen mask as a result of raising the circuit board.

As shown in FIG. 4, the control device 31 subsequently raises the upper stage ascending and descending table 11, and stops the raising action of the ascending and descending table 11 in a state in which the upper surface of the circuit board 14 and upper surfaces of the side clampers 15 are in contact with the lower surface of the screen mask 21. At this time, since the screen mask 21 is destaticized, even if the upper surface of the circuit board 14 comes into contact with the lower surface of the screen mask 21, the discharge of static electricity from the screen mask 21 to the circuit board 14 does not occur. Thereafter, the control device 31 performs screen printing of a predetermined pattern on the upper surface of the circuit board 14 by moving the squeegee 22 while the squeegee 22 is in contact with the upper surface of the screen mask 21. At this time, as in the destaticizing action, the control device 31 also brings the lower surface of the screen mask 21 into close contact with the upper surfaces of the mask support members 17 using a negative pressure vacuuming force as a result of a negative pressure acting on the vacuum holes 27 on the upper surfaces of the mask support members 17.

Figure 5:
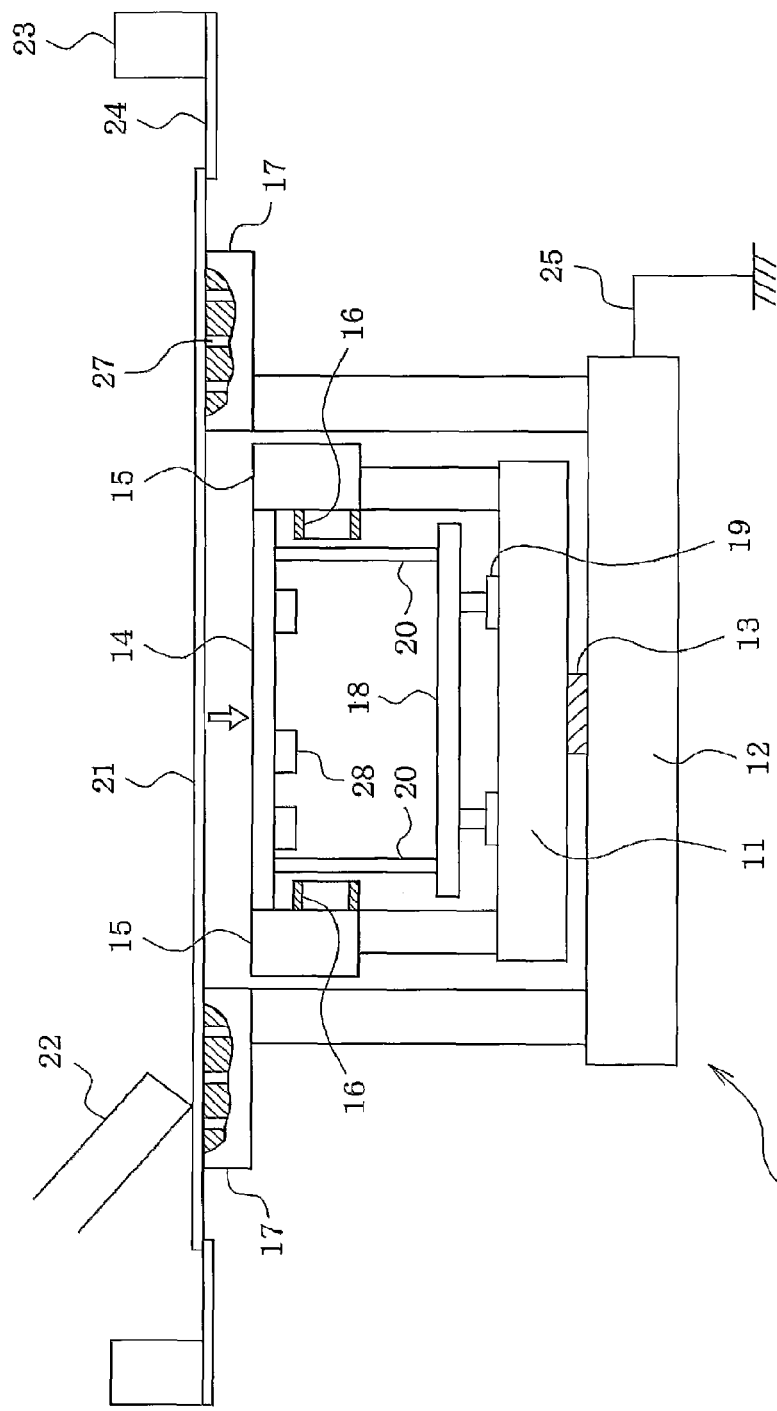
FIG. 5 is a view that describes a plate separation action that lowers the circuit board after screen printing with the mask support member remaining in a state of being in contact with the lower surface of the screen mask.
Figure 6:
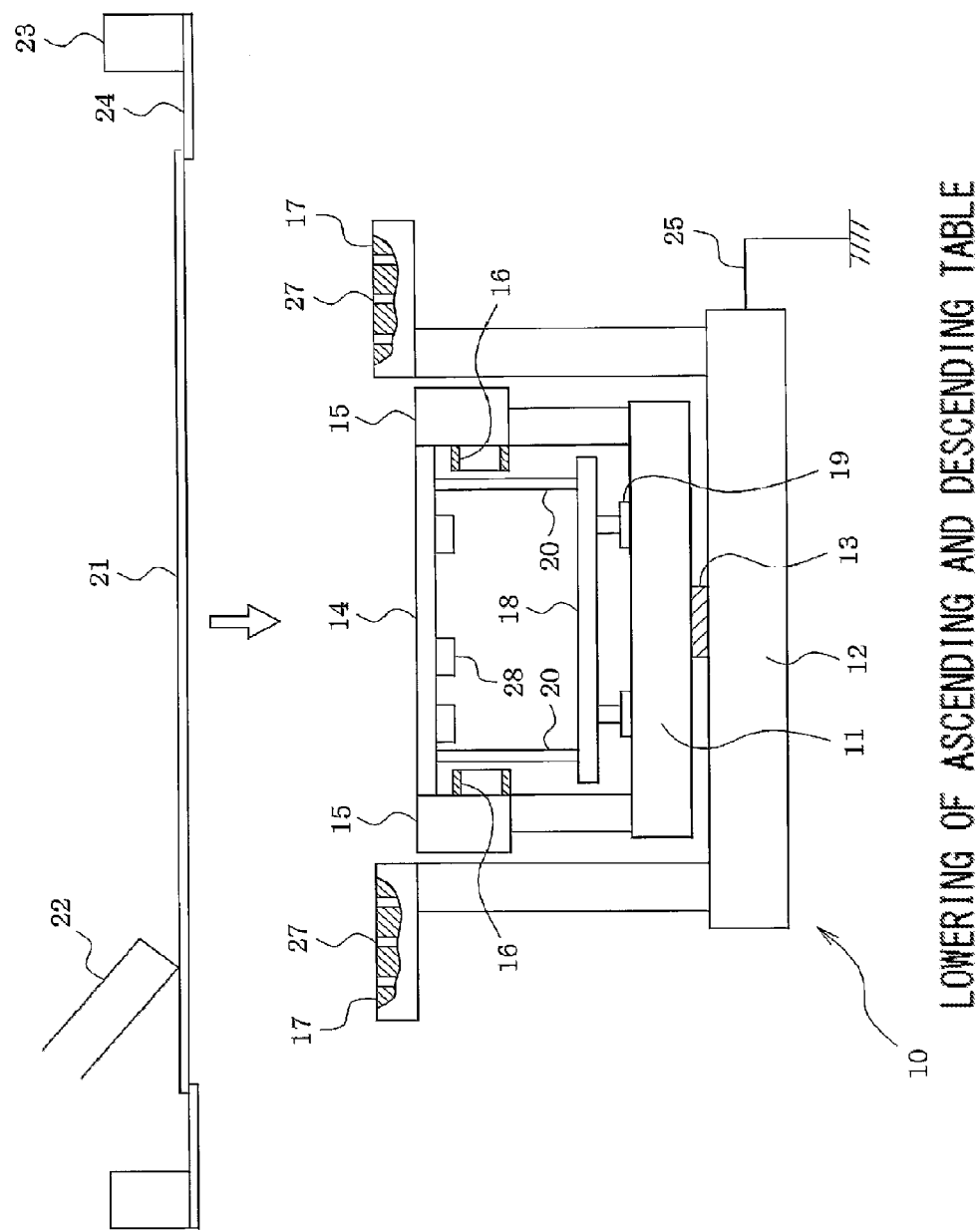
FIG. 6 is a view that describes an action that lowers the mask support member by lowering an ascending and descending table.

As shown in FIG. 5, the control device 31 subsequently cancels the negative pressure, proceeds to a plate separation action, and separates the circuit board 14 and the side clampers 15 from the screen mask 21 from below by lowering the upper stage ascending and descending table 11. As shown in FIG. 6, the control device 31 subsequently separates the mask support members 17 from the screen mask 21 downwardly by lowering the lower stage ascending and descending table 12, and lowers the circuit board 14 and the side clampers 15 to an original height position. Thereafter, the control device 31 places the circuit board 14 on the conveyor 16 by lowering the back-up plate 18 using the ascending and descending mechanism 19, releases the clamping of the circuit board 14 by widening the interval between the side clampers 15, and carries the circuit board 14 out by starting a transport action of the conveyor 16. Hereafter, the control device 31 performs screen printing by bringing the circuit board 14 into contact with the lower surface of the screen mask 21 after performing the destaticizing action of the screen mask 21 each time a circuit board 14 is carried in.

According to the present embodiment that has been described above, since it is possible to remove static electricity with which the screen mask 21 is charged, through the conductive mask support members 17 before bringing the circuit board 14 into contact with the lower surface of the screen mask 21, by performing a raising action of the mask support members 17 at a timing that is earlier than a raising action of the circuit board 14, it is possible to reliably prevent the discharge of static electricity from the screen mask 21 to the circuit board 14, and therefore, it is possible to reliably prevent damage to the electronic component 28 due to the discharge of static electricity from the screen mask 21. Additionally, an action that makes the raising timing of the mask support members 17 earlier than the raising timing of the circuit board 14 can be automatically controlled by the screen printing device 10, and it is not necessary for an operator to perform the reattachment of the earth line 25 or the change of a position of a destaticizing brush each time the screen mask 21 is exchanged, and therefore, it is possible to simplify the exchange work of the screen mask 21 by that extent. In addition, since the destaticizing action of the present embodiment can correspond due to changes in a control program of the screen printing device 10 only, it is possible to realize a destaticizing function of static electricity at low cost.

The present disclosure may be configured so as to even perform screen printing by bringing the circuit board 14 into contact with the lower surface of the screen mask 21 after performing the abovementioned destaticizing action of the screen mask 21 in a case of performing screen printing on an upper surface of a circuit board 14 on which the electronic component 28 is not mounted on a lower surface thereof, but in consideration of the fact that it is likely that damage to the electronic component 28 due to the discharge of static electricity from the screen mask 21 will easily occur in a case of performing screen printing on an upper surface of a circuit board 14 on which the electronic component 28 is mounted on a lower surface thereof, in the manner of the abovementioned embodiment, may be configured so as to perform screen printing after performing the destaticizing action in a case of performing screen printing on an upper surface of a circuit board 14 on which the electronic component 28 is mounted on a lower surface thereof only, and perform screen printing by bringing the mask support members 17 and the circuit board 14 into contact with the lower surface of the screen mask 21 as a result of simultaneously raising the mask support members 17 and the circuit board 14 in a state in which the heights of the respective upper surfaces of the mask support members 17 and the circuit board are aligned without performing the destaticizing action in a case of performing screen printing on an upper surface of a circuit board 14 on which the electronic component 28 is not mounted on a lower surface thereof. Since, in comparison with a case in which an electronic component 28 is mounted on a lower surface of a circuit board 14, adverse effects due to the discharge of static electricity from the screen mask 21 are scarce in a case of performing screen printing on an upper surface of a circuit board 14 on which an electronic component 28 is not mounted on a lower surface thereof, if screen printing is performed by bringing the mask support member 17 and the circuit board 14 into contact with the lower surface of the screen mask 21 as a result of simultaneously raising the mask support member and the circuit board without performing the destaticizing action, it is possible to reduce the time required to perform screen printing once by the amount of time taken to perform the destaticizing action, and therefore, it is possible to improve the productivity.

The present disclosure may be configured so as to perform the destaticizing action each time before performing screen printing, but since it is thought that the charge amount of the static electricity with which the screen mask 21 is charged by a single screen printing is comparatively small, the present disclosure may be configured so as to perform screen printing performing the destaticizing action each time that screen printing, which does not perform the destaticizing action, is performed a predetermined number of times (or in other words, each time the screen mask 21 is charged with a charge amount for which discharge is possible). According to this configuration, it is possible to greatly reduce the number of times that the destaticizing action is performed with respect to the number of times of screen printing.

Additionally, the present disclosure is not limited to the abovementioned embodiment, and naturally, can be implemented using various changes within a range that does not depart from the scope there such as being configured so that the earth line 25 is connected to the mask support members 17, and static electricity, which the screen mask 21 is charged with, is released to the earth side through a pathway of the mask support members 17→the earth line 25, or in addition, being configured so that a movement mechanism of the side clamper 15, a movement mechanism of the back-up plate 18, or a movement mechanism of the mask support members 17 are changed as appropriate.

REFERENCE SIGNS LIST

10 . . . Screen printing device, 11 . . . upper stage ascending and descending table, 12 . . . lower stage ascending and descending table, 14 . . . circuit board, 15 . . . side clamper, 16 . . . conveyor, 17 . . . mask support member, 18 . . . back-up plate, 21 . . . screen mask, 22 . . . squeegee, 25 . . . earth line, 27 . . . vacuum hole, 28 . . . electronic component, 31 . . . control device

The invention claimed is:

1. A screen printing method that performs screen printing of a predetermined pattern on an upper surface of a circuit board, which is carried into an area below a screen mask, by raising the circuit board, holding the circuit board in a state of coming into contact with a lower surface of the screen mask, and moving a squeegee while the squeegee is in contact with an upper surface of the screen mask, the method comprising:

performing a destaticizing action that removes static electricity with which a screen mask is charged, through a conductive mask support member, which is positioned on a lateral side of the circuit board, before bringing the circuit board into contact with the lower surface of the screen mask, by bringing the mask support member into contact with the lower surface of the screen mask as a result of raising the mask support member; and subsequently performing screen printing by bringing the circuit board into contact with the lower surface of the screen mask as a result of raising the circuit board.

2. The screen printing method according to claim 1,
wherein screen printing is performed after performing the destaticizing action in a case of performing screen printing on an upper surface of a circuit board on which an electronic component is mounted on a lower surface thereof, and screen printing is performed by bringing the mask support member and the circuit board into contact with the lower surface of the screen mask as a result of simultaneously raising the mask support member and the circuit board in a state in which the heights of the respective upper surfaces of the mask support member and the circuit board are aligned without performing the destaticizing action in a case of performing screen printing on an upper surface of a circuit board on which an electronic component is not mounted on a lower surface thereof.

3. The screen printing method according to claim 1,
wherein the destaticizing action is performed each time that screen printing, which does not perform the destaticizing action, is performed a predetermined number of times.

4. The screen printing method according to claim 1,
wherein a vacuum hole, which vacuums the screen mask at a negative pressure during screen printing, is formed on an upper surface of the mask support member, and when the destaticizing action is performed, the upper surface of the mask support member is brought into close contact with the lower surface of the screen mask using a negative pressure vacuuming force as a result of a negative pressure acting on the vacuum hole.

5. A screen printing device that performs screen printing of a predetermined pattern on an upper surface of a circuit board, which is carried into an area below a screen mask, by raising the circuit board, holding the circuit board in a state of coming into contact with a lower surface of the screen mask, and moving a squeegee while the squeegee is in contact with an upper surface of the screen mask, the screen printing device comprising:

a conductive mask support member that is positioned on a lateral side of the circuit board, is provided so as to be capable of ascending and descending, and supports and holds up the screen mask from below; and control means for individually controlling an ascending and descending action of the circuit board, an ascending and descending action of the mask support member, and a movement action of a squeegee, wherein the control means performs a destaticizing action that removes static electricity with which the screen mask is charged, through the mask support member before bringing the circuit board into contact with a lower surface of the screen mask, by bringing the conductive mask support member into contact with the lower surface of the screen mask as a result of raising the mask support member; and subsequently performs screen printing by bringing the circuit board into contact with the lower surface of the screen mask as a result of raising the circuit board.

6. The screen printing device according to claim 5,
wherein the control means performs screen printing after performing the destaticizing action in a case of performing screen printing on an upper surface of a circuit board on which an electronic component is mounted on a lower surface thereof, and performs screen printing by bringing the mask support member and the circuit board into contact with the lower surface of the screen mask as a result of simultaneously raising the mask support member and the circuit board in a state in which the heights of the respective upper surfaces of the mask support member and the circuit board are aligned without performing the destaticizing action in a case of performing screen printing on an upper surface of a circuit board on which an electronic component is not mounted on a lower surface thereof.

7. The screen printing device according to claim 5,
wherein the control means performs the destaticizing action each time that screen printing, which does not perform the destaticizing action, is performed a predetermined number of times.

8. The screen printing device according to claim 5,
wherein a vacuum hole, which vacuums the screen mask at a negative pressure during screen printing, is formed on an upper surface of the mask support member, and when the destaticizing action is performed, the control means brings the upper surface of the mask support member into close contact with the lower surface of the screen mask using a negative pressure vacuuming force as a result of a negative pressure acting on the vacuum hole.

* * * * *